US 7,919,883 B2
Apr. 5, 2011

(12) United States Patent
Urman et al.

(10) Patent No.: US 7,919,883 B2
(45) Date of Patent: Apr. 5, 2011

(54) TWO-WIRE ADAPTER

(75) Inventors: Robert Urman, Schaumburg, IL (US);
James W. Citta, Lombard, IL (US)

(73) Assignee: Wabtec Holding Corp., Wilmerding, PA (US)

( * ) Notice: Subject to any disclaimer, the term of this patent is extended or adjusted under 35 U.S.C. 154(b) by 232 days.

(21) Appl. No.: 12/293,561

(22) PCT Filed: Apr. 17, 2007

(86) PCT No.: PCT/US2007/009315
§ 371 (c)(1),
(2), (4) Date: Dec. 17, 2008

(87) PCT Pub. No.: WO2007/127094
PCT Pub. Date: Nov. 8, 2007

(65) Prior Publication Data
US 2010/0231036 A1    Sep. 16, 2010

Related U.S. Application Data

(60) Provisional application No. 60/793,972, filed on Apr. 21, 2006.

(51) Int. Cl.
*B60L 1/00* (2006.01)
*G05F 1/10* (2006.01)
(52) U.S. Cl. .......................................... 307/9.1; 307/326
(58) Field of Classification Search .................... 307/9.1, 307/10.1, 326–328
See application file for complete search history.

(56) References Cited

U.S. PATENT DOCUMENTS

| 4,022,996 A | 5/1977 | Lucas et al. |
|---|---|---|
| 4,371,762 A | 2/1983 | Diamond |
| 4,431,882 A | 2/1984 | Frame |
| 4,562,315 A | 12/1985 | Aufderheide |
| 5,118,910 A | 6/1992 | Duhon et al. |
| 5,134,259 A | 7/1992 | Page, Jr. |
| 5,583,386 A | 12/1996 | Meixner et al. |
| 5,775,232 A | 7/1998 | Golemis et al. |
| 5,942,815 A | 8/1999 | Neuman et al. |
| 6,064,165 A | 5/2000 | Boisvert et al. |
| 6,344,642 B1 | 2/2002 | Agam et al. |
| 6,495,933 B2 * | 12/2002 | Tokuda et al. ................ 307/326 |
| 6,661,410 B2 | 12/2003 | Casebolt et al. |
| 6,768,420 B2 | 7/2004 | McCarthy et al. |
| 6,825,765 B2 | 11/2004 | Stanley et al. |
| 6,949,937 B2 | 9/2005 | Knoedgen |

(Continued)

FOREIGN PATENT DOCUMENTS
EP    0244807 A1    11/1987
(Continued)

OTHER PUBLICATIONS

Motorola, Analog Products, MC33794 Fact Sheet, 33794 Electric Field Imaging Device, 2. pp. 2002, Motorola, Inc. MC33794FS/D Rev.1.

(Continued)

*Primary Examiner* — Fritz M Fleming
(74) *Attorney, Agent, or Firm* — The Webb Law Firm

(57) ABSTRACT

A two-wire adapter circuit comprises a current shunt monitor and a circuit for sensing an abrupt change in the output of the current shunt monitor, a power supply, and a two-wire electrical conduit connecting the power supply to a load via the current shunt monitor, the circuit for sensing the abrupt change in the output of the current shunt monitor configured to output a defined digital signal on a third wire upon sensing the abrupt change.

4 Claims, 3 Drawing Sheets

U.S. PATENT DOCUMENTS 7,208,694 B2 * 4/2007 Urman et al. .............. 200/600
2005/0231147 A1 10/2005 Urman et al.

FOREIGN PATENT DOCUMENTS

| EP | 1235190 A1 | 8/2002 |
| FR | 2377611 A1 | 8/1978 |
| WO | 9636134 A1 | 11/1996 |
| WO | 0015931 A1 | 3/2000 |

OTHER PUBLICATIONS

Eady, F., "E-Field Evaluation Module", Circuit Cellar, Jun. 2003, pp. 1-7, Issue 155.

* cited by examiner

TWO-WIRE ADAPTER

BACKGROUND OF THE INVENTION

1. Field of the Invention

This invention relates to an electrical circuit for generating a defined digital signal in response to a change in the load in a remote sensing circuit and has application, for example, in mass transit vehicles that have passenger presence sensing circuits associated with vehicle doors. The electrical circuit generates a defined digital input to the vehicle control computer.

2. Description of Related Art

This application relates to sensing of the presence of passengers at the doors of mass transit vehicles. The prior art is described in our co-pending application Ser. No. 11/084,789 entitled "Capacitance Activated Switch Device" incorporated herein by reference. As explained therein, it is common for vehicle operators to be able to place certain doors in a condition enabling passengers to open such doors by contacting a switch mounted on the side of the door, such as a mechanically-operated touch bar. In our co-pending application, we describe a capacitance-activated switch device attached to the door that senses the presence of a passenger entering an alternating electric field. Electrical conduits supply power to the switch. The electrical conduits are used to signal the presence of a passenger at the door. The conduits are fed through a limited space along the hinged edge of the door. Space is also limited for circuitry attached to the door itself. It is an advantage, according to this invention, to address these space limitations by using the two-wire power leads to the door mounted or remote sensor circuit to signal the passenger presence at the door.

SUMMARY OF THE INVENTION

Briefly, according to one aspect of this invention, there is provided a two-wire adapter. A two-wire electrical conduit connects a power supply to a load via a current shunt monitor. A circuit is provided for sensing an abrupt change in the output of the current shunt monitor due to a change in the current drawn by the load. The circuit for sensing an abrupt change is configured to output a defined digital signal on a third wire upon sensing an abrupt change.

Briefly, according to another aspect of this invention, there is provided an annunciator circuit having a remote circuit including a voltage regulator and sensing circuit and a two-wire adapter circuit comprising a current shunt monitor and a circuit for sensing an abrupt change in the output of the current shunt monitor. A two-wire electrical conduit connects a power supply to the voltage regulator of the remote circuit via a resistor in parallel with the current shunt monitor. The sensing circuit in the remote circuit connects the output of the voltage regulator to a shunt resistor to place an additional drain on the voltage regulator upon detection of a sensed condition. The circuit for sensing an abrupt change in the output of the current shunt monitor due to the additional drain on the voltage regulator is configured to output a defined digital signal on sensing an abrupt change. Preferably, the annunciator circuit further comprises high-side and low-side drives connected to receive the defined digital output signal.

According to yet another aspect of this invention, an annunciator circuit comprises an electric field-sensing circuit comprising a remote circuit including a voltage regulator and circuit for sensing the change in capacitance in an ac electric field. A two-wire adapter circuit comprises a current shunt monitor and a circuit for sensing an abrupt change in the output of the current shunt monitor. A two-wire electrical conduit connects a power supply to the voltage regulator of the remote circuit via a resistor in parallel with the current shunt monitor. The sensing circuit in the remote circuit connects the output of the voltage regulator to a shunt resistor to place an additional drain on the voltage regulator upon detection of a sensed condition. The circuit for sensing an abrupt change in the output of the current shunt monitor due to the additional drain on the voltage regulator is configured to output a defined digital signal on a third wire upon sensing an abrupt change.

According to still another aspect of this invention, an annunciator circuit for generating an input to a control computer on a mass transit vehicle comprises an electric field-sensing circuit for sensing the presence of a passenger at a mass transit vehicle door, including a circuit having a voltage regulator and circuit for sensing the change in capacitance in an ac electric field associated with the vehicle door. A two-wire adapter circuit is positioned above the vehicle door comprising a current shunt monitor and a circuit for sensing an abrupt change in the output of the current shunt monitor. A two-wire electrical conduit is connectable to a power supply and extends from above the door and to the voltage regulator of the sensing circuit via a resistor in parallel with the current shunt monitor. The sensing circuit connects the output of the voltage regulator to a shunt resistor to place an additional drain on the voltage regulator upon detection of a passenger at the vehicle door. The circuit for sensing an abrupt change in the output of the current shunt monitor due to the additional drain on the voltage regulator is configured to output a defined digital signal on a third wire upon sensing an abrupt change.

BRIEF DESCRIPTION OF THE DRAWINGS

Further features and other objects and advantages will become apparent from the following detailed description made with reference to the drawings in which.

DESCRIPTION OF THE PREFERRED EMBODIMENTS

Figure 2:
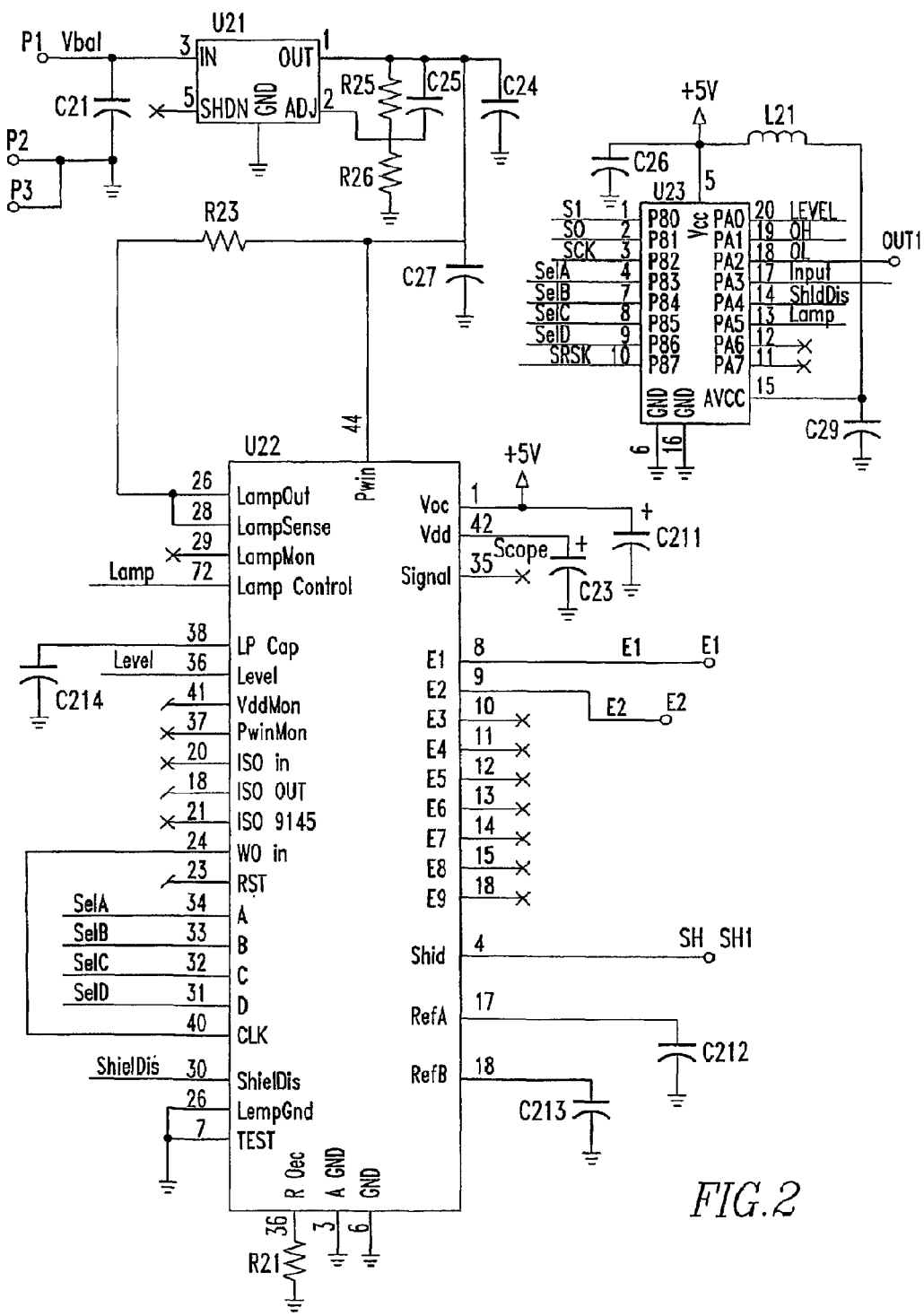
FIG. 2 is a circuit diagram for a remote capacitance-sensing circuit according to one embodiment of this invention.

Referring to FIG. 2, there is illustrated a remote capacitance touch sensor circuit based upon an electric field imaging device that senses objects entering a low level electric field and measures the capacitive loading of the field caused by objects moving into the field. A two-wire input at P1 and P2 supplies power to the remote circuit via voltage controller U21. Associated with integrated circuit U21 are capacitors C21, C24 and C25 and resistors R25 and R26. An integrated circuit U22 (MC33794 sold by Freescale) provides most of the function of the touch sensor circuit. A low frequency sine wave is generated by the integrated circuit U22 which is applied to a volume by electrodes E1 and E2. Associated with integrated circuit U22 are capacitors C211, C212, C213, C214 and C23 and resistor R21. The digitized capacitance detected by U22 is processed by microcontroller U23 to detect an abrupt change in capacitance. Associated with integrated circuit U23 are capacitors C26 and C29 and inductor L21. Up to this point, the circuit of FIG. 2 is basically as described in our co-pending application identified above.

When the presence of an object is detected, the output of the voltage regulator U21 is shunted through resistor R23. The resistance of the resistor R23 is chosen to provide a small but significant increased load on the voltage regulator. The presence of resistor R23 is a feature new to this application. In the specific embodiment described with reference to FIG. 2, the resistance of resistor R23 is set at 475 ohms so that the increased load will be about 20 mA.

Figure 1:
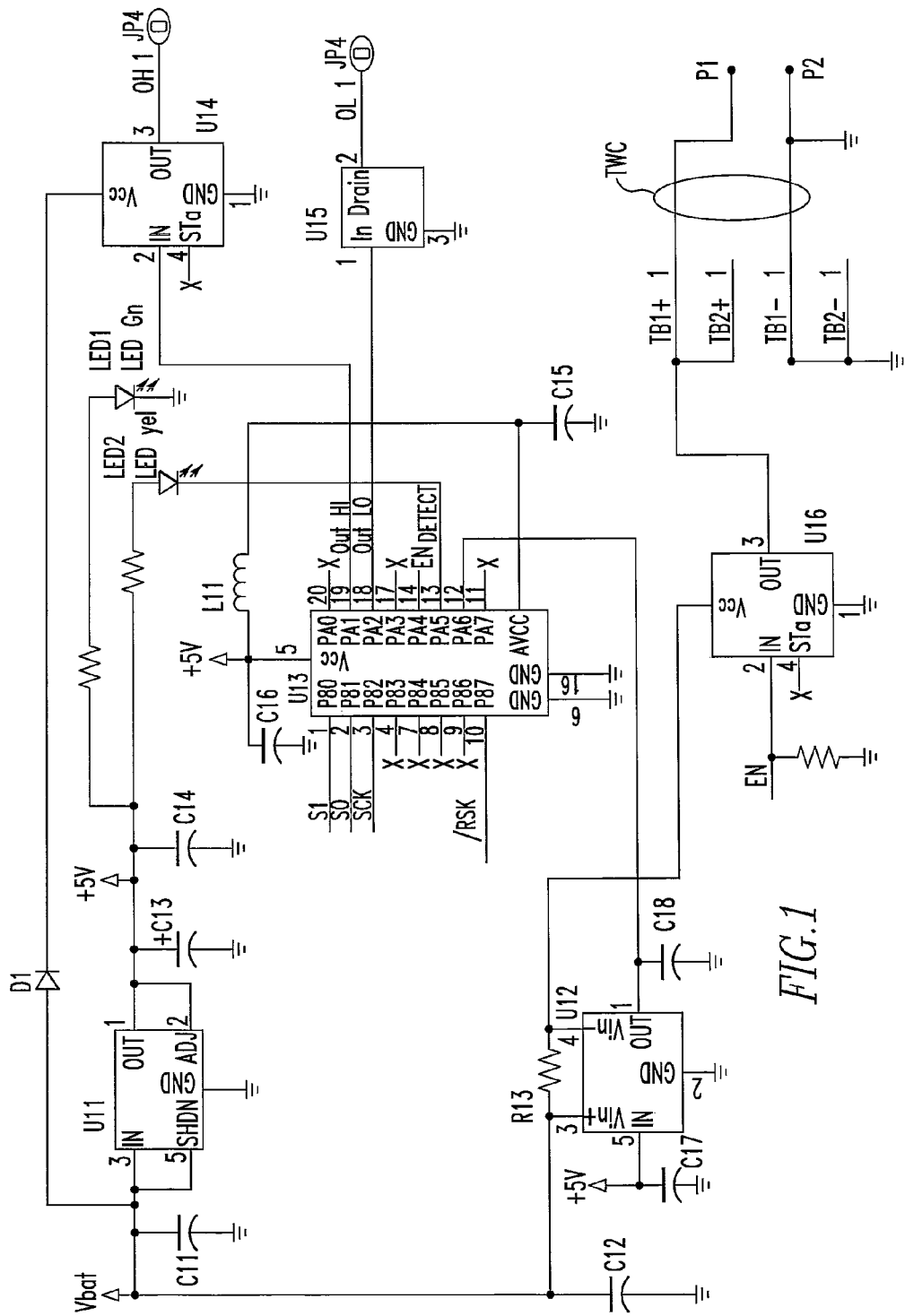
FIG. 1 is a circuit diagram for a two-wire adapter circuit according to one embodiment of this invention.

Referring now to FIG. 1, there is shown an embodiment of a two-wire adapter circuit according to this invention. A power supply is indicated at Vbat. The power supply feeds a voltage regulator U11 that powers microcontroller U13 and shunt monitor IC U12. Associated with voltage regulator U11 are capacitors C11 and C13. Associated with microcontroller U13 are capacitors C15 and C16 and inductor L11. Associated with shunt monitor U12 are capacitors C17 and C18. A current shunt monitor U12 is connected to each side of a small resistor R13. The power supply is connected to terminals TB1+ and TB2+, for example, which are then connected through a two-wire conduit (TWC) to respective voltage regulators of the sensing circuits shown in FIG. 2. The terminals TB1+ and TB1− correspond to a sensing circuit for one side of a double swinging door of a transit vehicle, for example. The terminals TB2+ and TB2− correspond to the other door.

In the preferred embodiment, U16 is placed between R13 and TB1+ and TB2+. If the current draw through R13 is excessive due to an accidental short at TB1+ or TB2+, the microcontroller U13 can disconnect R13 by pulling up enable pin 2 EN or U16 preventing R13 from being destroyed.

As indicated in FIG. 1, the output voltage of the current shunt monitor in this particular embodiment is twenty times the voltage drop sensed across the resistor R13. For a 20 mA change in current through the resistor R13, the output voltage would change 400 mV.

Figure 3:
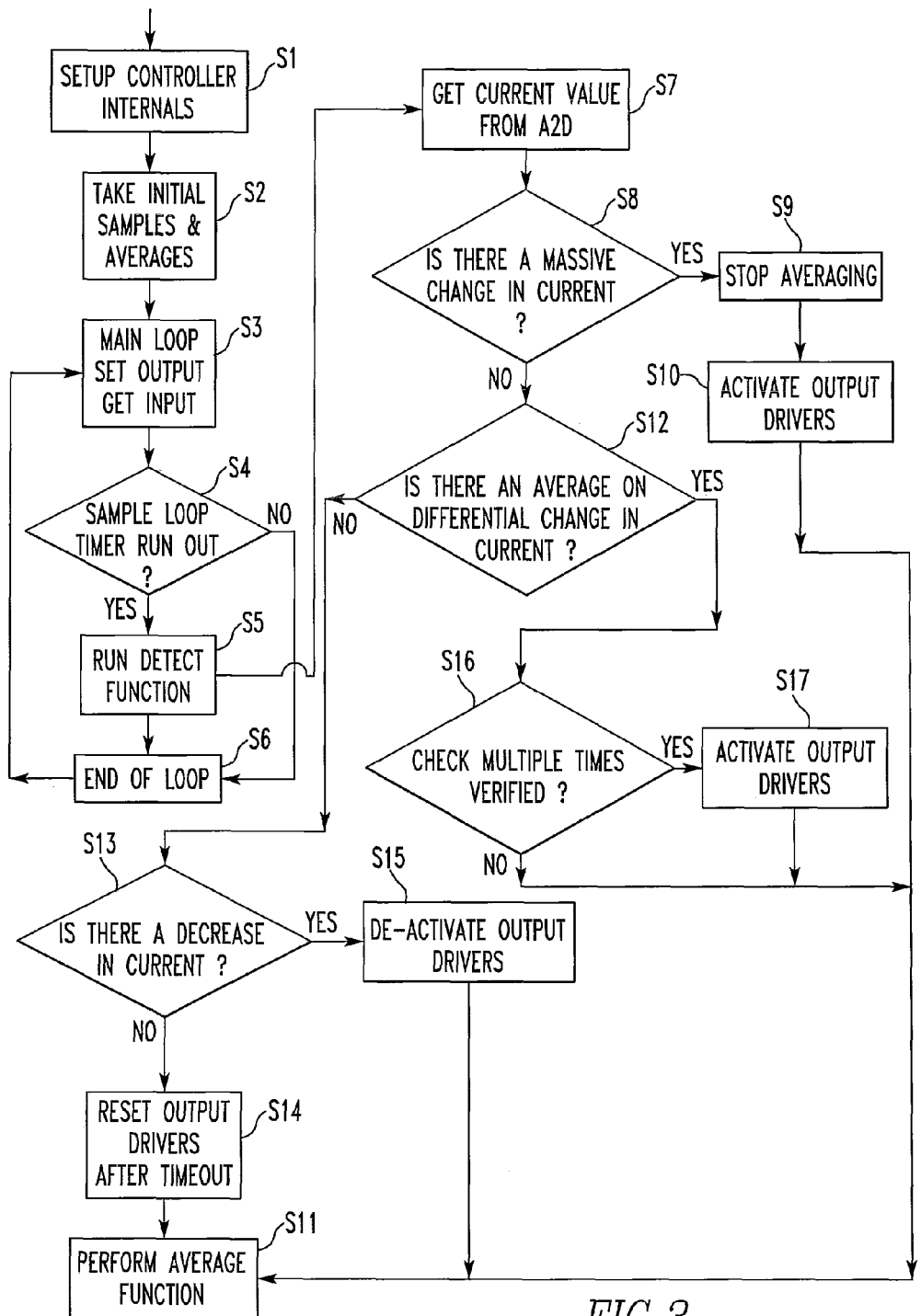
FIG. 3 is a simplified flow diagram of the program stored in the microcontroller U13 of FIG. 1.

As shown in FIG. 3, the analog output of the shunt monitor is repeatedly digitized by microcontroller U13 and stored in a rolling memory so that the trend over a short period can be observed and abrupt changes can be recognized. Gradual changes in the current through resistor R13 due to various factors, such as drift in the battery voltage, the temperature of the resistor R13, or the effects of temperature on the circuit shown in FIG. 2 will not result in an output from the microcontroller. When the microcontroller does produce an output, it activates both the high-side and low-side drivers U14 and U15 having outputs OH and OL respectively. Typically, only one of those will be connected to the vehicle computer (depending on the vehicle computer's logical input requirements).

Referring to FIG. 3, Steps S1 to S6 comprise a setup loop in which the controller internals are setup at S1 and initial samples and averages are detected and computed at S2. Thereafter, a timer loop comprising steps S3 to S6 at spaced time intervals calls the detect function at S5 transferring control to Step S7 to get the current values at the analog to digital converter. A test for a massive change in current is made at S8. If such change has taken place, averaging is stopped at S9 and the output drivers are activated at S10. If, however, no massive change in current is detected at S8, a test is made at S16 to determine if there is a rolling average for determining differential change in current. If so, the change is checked multiple times to verify the change and if verified the output drivers are activated at S17. If, however, there is no average for determining differential change in current at S12, a test is made at S13 to determine if there has been a decrease in current. If so, the drivers are deactivated at S15. If not, output timers are reset after time out at S14 and the averages function is performed at S11. Finally, if verification cannot be made at S16, the averages function is performed at S11.

We have described the two-wire adapter circuit in the setting of a capacitance-activated switch used with doors on a transit vehicle. However, it should be clear that any device (proximity switch, Hall switch, etc.) may use the two-wire adapter circuit.

Having thus defined our invention in the detail and particularity required by the Patent Laws, what is desired protected by Letters Patent is set forth in the following claims.

The invention claimed is:

1. An annunciator circuit comprising:
   a remote circuit including a voltage regulator and sensing circuit;
   a two-wire adapter circuit spaced from said remote circuit comprising a current shunt monitor monitoring the current in a parallel resistor and a circuit for sensing an abrupt change in the output of the current shunt monitor;
   a power supply;
   a two-wire electrical conduit extending between the remote circuit and the two-wire adapter circuit and connecting the power supply to the voltage regulator of the remote circuit via said resistor in parallel with the current shunt monitor of the two-wire adapter circuit; and
   the sensing circuit in the remote circuit switching the output of the voltage regulator to a shunt resistor to place an additional drain on the voltage regulator upon detection of a sensed condition,
   said circuit for sensing the abrupt change in the output of the current shunt monitor due to the additional drain on the voltage regulator configured to output a defined digital signal on sensing the abrupt change.

2. The annunciator circuit according to claim 1, further comprising high-side and low-side drivers connected to receive the digital signal output from the circuit for sensing abrupt change in the output of the current shunt monitor.

3. An annunciator circuit comprising an electric field-sensing circuit comprising:
   a remote circuit including a voltage regulator and circuit for sensing a change in capacitance in an ac electric field;
   a two-wire adapter circuit spaced from said remote circuit comprising a current shunt monitor monitoring the current in a parallel resistor and a circuit for sensing an abrupt change in the output of the current shunt monitor;
   a power supply;
   a two-wire electrical conduit extending between the remote circuit and the two-wire adapter circuit and connecting the power supply to the voltage regulator of the remote circuit via said resistor in parallel with the current shunt monitor of the two-wire adaptor circuit; and
   the sensing circuit in the remote circuit switching the output of the voltage regulator to a shunt resistor to place an additional drain on the voltage regulator upon detection of a sensed condition,
   said circuit for sensing the abrupt change in the output of the current shunt monitor due to the additional drain on the voltage regulator configured to output a defined digital signal on a third wire upon sensing the abrupt change.

4. An annunciator circuit for generating an input to a control computer on a mass transit vehicle comprising an electric field-sensing circuit for sensing the presence of a passenger at a mass transit vehicle door comprising:

a door circuit including a voltage regulator and circuit for sensing a change in capacitance in an ac electric field associated with the vehicle door;

a two-wire adapter circuit positioned above the vehicle door comprising a current shunt monitor monitoring the current in a parallel resistor and a circuit for sensing an abrupt change in the output of the current shunt monitor;

a two-wire electrical conduit extending from above the door and connectable to a power supply and to the voltage regulator of the circuit via a resistor in parallel with the current shunt monitor; and the sensing circuit switching the output of the voltage regulator to a shunt resistor to place an additional drain on the voltage regulator upon detection of a passenger at the vehicle door, said circuit for sensing the abrupt change in the output of the current shunt monitor due to the additional drain on the voltage regulator configured to output a defined digital signal on a third wire upon sensing the abrupt change.

* * * * *